United States Patent
Braendli et al.

(10) Patent No.: US 9,496,008 B1
(45) Date of Patent: Nov. 15, 2016

(54) DETERMINATION OF A COMMON MODE VOLTAGE

(71) Applicant: International Business Machines Corporation, Armonk, NY (US)

(72) Inventors: Matthias Braendli, Otelfingen (CH); Marcel A. Kossel, Reichenburg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/729,100

(22) Filed: Jun. 3, 2015

(51) Int. Cl.
*G11C 5/14* (2006.01)
*G11C 11/4074* (2006.01)

(52) U.S. Cl.
CPC ........... *G11C 5/147* (2013.01); *G11C 11/4074* (2013.01)

(58) Field of Classification Search
None
See application file for complete search history.

(56) References Cited

U.S. PATENT DOCUMENTS

| | | | |
|---|---|---|---|
| 6,747,588 B1 * | 6/2004 | Huang | H03M 1/0656 341/145 |
| 8,102,724 B2 | 1/2012 | Fox et al. | |
| 8,850,155 B2 | 9/2014 | Brandl et al. | |
| 2010/0013454 A1 | 1/2010 | Dreps | |
| 2010/0188918 A1 * | 7/2010 | Fox | G06F 13/4086 365/226 |
| 2014/0119137 A1 | 5/2014 | Mozak et al. | |
| 2014/0149654 A1 | 5/2014 | Venkatesan et al. | |

OTHER PUBLICATIONS

"An Essay on Endian Order" by Dr. William T. Verts, Apr. 19, 1996.*
Disclosed Anonymously, "Setting Memory Device Vref in a Memory Controller and Memory Device Interface in a Communication Bus", IP.com No. 000196496, IP.com Electronic Publication: Jun. 3, 2010, 6 pages.
Sethuraman et al., "Vref optimization in DDR4 RDIMMs for improved timing margins", 2014 IEEE, Systems & Technology Group, IBM, pp. 1-4.
Altera, "DDR4: Designing for Power and Performance", 2013 Altera Corporation-Public, Measurable Advantage, pp. 1-48.
JEDEC, "DDR4 Mini Workshop", Server memory Forum 2011, Global Standards for the Microelectronic Industry, pp. 1-14.

* cited by examiner

*Primary Examiner* — James G Norman
(74) *Attorney, Agent, or Firm* — L. Jeffrey Kelly

(57) ABSTRACT

The invention relates to a receiving unit for performing a calibration of a reference voltage, comprising a reference voltage unit for generating and applying a reference voltage on the evaluation unit depending on a converter value, an evaluation unit for receiving a single-ended data signal and being configured to determine an evaluation signal based on the data signal and the reference voltage, and a logic unit configured to perform a calibration process for calibrating the reference voltage. The logic unit is configured to command a memory device to apply a permanent digital logical state on a data line, to iteratively adapt a converter voltage to substantially match the voltage level of the logical state on the data line, and to determine the reference voltage depending on the converter voltage for which the voltage level of the logical state on the data line has been substantially matched.

20 Claims, 3 Drawing Sheets

DETERMINATION OF A COMMON MODE VOLTAGE

BACKGROUND

The present invention relates to methods for determining common mode voltages, particularly for use for discriminating data received by a memory device, such as a synchronous dynamic random access memory (SDRAM).

Double data rate physical layer designs employ a multi-drop bus for communication between a memory controller and a synchronous dynamic random access memory device. The multi-drop bus has a number of single-ended and unidirectional command lines and single-ended and bidirectional data lines. Each of the command and data lines is associated with an additional differential pair of clock lines to perform a source-synchronous operation.

The determination of the incoming data on a data line may be done in an evaluation unit of a receiver in the memory controller. To determine the logical level of the received single-ended data, the receiver comprises a comparator, which compares the received signal to a reference voltage. Ideally, the reference voltage is chosen equal to the common mode voltage of the received signal. Signal voltages higher than the common mode level are assigned to a logical "1", those below are assigned to a logical "0". In practice, an amplification or equalization stage is used in front of the comparator or data slicer. Analogously to the comparator the reference voltage at the input differential pair of the continuous-time linear equalizer (CTLE) is chosen equal to the common mode level of the received single-ended signal. The provision of a reference voltage that equals the common mode voltage for each of the single-ended data lines is therefore required in the memory controller.

An appropriate determination of the reference voltage is key to determining the eye opening in the evaluation unit of the memory controller. The closer the reference voltage is chosen to the actual common voltage of the data signal on the respective data line, the wider the eye opening of the received data gets.

Document US 2014/0119137 A1 discloses a computing system comprising a processor, a memory to be coupled to the processor and to interpret digital data, received over a memory bus, based on a reference voltage, and a voltage control circuit to dynamically adjust the reference voltage. The dynamical adjustment of the reference voltage is based on a statistical analysis (e.g. bit error rate measurements) and requires a sufficiently high statistical confidence level (e.g. 95%), which requires long measurements times.

In document "Setting Memory Device Vref In A Memory Controller and Memory Device Interface in a Communication Bus", IP.COM Disclosure, No. IPCOM000196496D, Jun. 3, 2010 discloses a method for improving the AC performance characteristics of an interface by making adjustments to the $V_{high}$ and $V_{low}$ reference levels that are detected by the receiving devices and ultimately matching them to the actual high and low values seen in system operation. This adjustment is normally accomplished during the time when the system is powered up and is performing driver training with deterministic data patterns. By matching the $V_{high}$ and $V_{low}$ reference levels as sensed by the controller to a double data rate dynamic random access memory (DDR DRAM), a more accurate $V_{ref}$ for the DDR DRAM device will compensate for differences from the expected value due to variations in driver strength, termination strength, board resistor impedance variation, and other parasitic effects.

SUMMARY

According to an embodiment of the present invention, a method is provided. The method may include a receiving unit for performing a calibration of a reference voltage. The receiving unit may include a reference voltage unit for generating and applying a reference voltage on the evaluation unit depending on a converter value, an evaluation unit for receiving a single-ended data signal and being configured to determine an evaluation signal based on the data signal and the reference voltage, a logic unit configured to perform a calibration process for calibrating the reference voltage. The logic unit is configured to command a memory device to apply a permanent digital logical state on a data line, to adapt, particularly iteratively adapt a converter voltage to substantially match the voltage level of the logical state on the data line, and to determine the reference voltage depending on the converter voltage for which the voltage level of the logical state on the data line has been substantially matched.

According to another embodiment of the present invention, a method for performing a calibration of a reference voltage is provided. The method may include receiving a single-ended data signal, commanding a memory device to apply a permanent digital logical state on a data line, adapting, particularly iteratively adapting a converter voltage to substantially match the voltage level of the logical state on the data line, and determining the reference voltage depending on the converter voltage for which the voltage level of the logical state on the data line has been substantially matched.

The above method may be performed in a device communicating with a memory device, such as a receiving unit of a memory controller. One idea of the above method is to command a connected memory device to apply a logical state on the data line and to successively adapt a converter voltage e.g. provided by a reference voltage unit implemented in the receiving unit of the memory controller. The converter voltage is compared to the voltage representing the logical state of the data line. Once the voltage level of the logical state has been passed by the converter voltage, a matching between the voltage level of the logical state and the converter voltage has been determined and the converter voltage is used to obtain a reference voltage which corresponds to a common mode voltage for the data line.

According to an embodiment, the digital logic state may correspond to a logical state whose voltage level is lower than a voltage level of another digital logical state.

Furthermore, the digital logical state may correspond to a logical "0".

It may be provided that the logic unit is configured to increment or decrement a counter for providing the converter value to successively approach to the voltage level of the logical state from one side of a voltage level to the other digital logical state on the data line.

According to a further embodiment, the voltage level of a logical "1" on the data line may correspond to a high supply voltage.

It may be provided that the logic unit is configured to determine the reference voltage by dividing by 2 the converter voltage for which the voltage level of the logical state on the data line has been substantially matched.

As memory devices often have a reference at the high supply voltage such as $V_{dd}$, the digital analog converter starts with binary 0 and counts high, while the corresponding output voltage of the reference voltage unit decreases. This allows a simple calculation of the common mode voltage by a division by two of the converter voltage which just had passed the voltage level of the logical "0" on the data line. The combination of the decreasing of the converter voltage by increasing converter values the reference voltage can be simply determined by a 1b-shift operation (1b-left-shift for big endian, 1b-right-shift for little endian) of the obtained converter value.

Moreover, the logic unit may be configured to determine the reference voltage by dividing by 2 the converter value for which the voltage level of the logical state on the data line has been substantially matched. The division by 2 is carried out by a 1-bit shift operation defined to obtain a converter value which indicates a voltage between the voltage levels of the logical "0" and the logical "1".

It may be provided that the converter value of the reference voltage unit is big endian coded, wherein the converter value for which the voltage level of the logical state on the data line has been substantially matched is divided by two by a left shift operation.

Furthermore, the converter value of the reference voltage unit may be little endian coded, wherein the converter value for which the voltage level of the logical state on the data line has been substantially matched is divided by two by a right shift operation.

According to an embodiment the logic unit may be implemented by a state machine.

According to a further aspect a memory controller comprising one of the above receiving units may be provided.

Furthermore, the digital logic state may correspond to a logical state whose voltage level is lower than a voltage level of another digital logical state. Particularly, the digital logical state may correspond to a logical "0".

Furthermore, a counter may be incremented or decremented for providing the converter value to successively approach to the voltage level of the logical state from a side of a voltage level of the other digital logical state on the data line.

The voltage level of a logical "1" on the data line may correspond to a high supply voltage.

It may be provided that the reference voltage is determined by dividing by 2 the converter voltage for which the voltage level of the logical state on the data line has been substantially matched.

The converter value for which the voltage level of the logical state on the data line has been substantially matched may be divided by two by a bit shift operation defined to obtain a converter value which indicates a voltage between the voltage levels of the logical "0" and the logical "1".

Furthermore, the converter value of the reference voltage unit may be big endian coded, wherein the converter value for which the voltage level of the logical state on the data line has been substantially matched is divided by two by a left shift operation.

Alternatively, the converter value of the reference voltage unit may be little endian coded, wherein the converter value for which the voltage level of the logical state on the data line has been substantially matched is divided by two by a right shift operation.

The description given above refers to a high-terminated signaling scheme such as for instance double data rate fourth generation synchronous dynamic random access memory (DDR-4) (multi-drop signaling). Note that the same principle of determining the reference voltage can be applied to a ground-referenced signaling scheme such as near-ground signaling (e.g., point-to-point signaling in graphics double data rate memory or GDDR). For a ground-referenced signaling the polarities of the evaluation logic and the supply rail can be inverted with respect to the description above but the basic operation principle of ramping up a digital analog converter (DAC) from binary 0 and dividing the binary code by 2 via a 1-bit shift operation when reaching the logical '1' remains the same.

BRIEF DESCRIPTION OF THE DRAWINGS

Embodiments are described in more detail in conjunction with the accompanying drawings in which.

DETAILED DESCRIPTION

In the following, a system for communicating with a memory device is described in detail.

Figure 1:
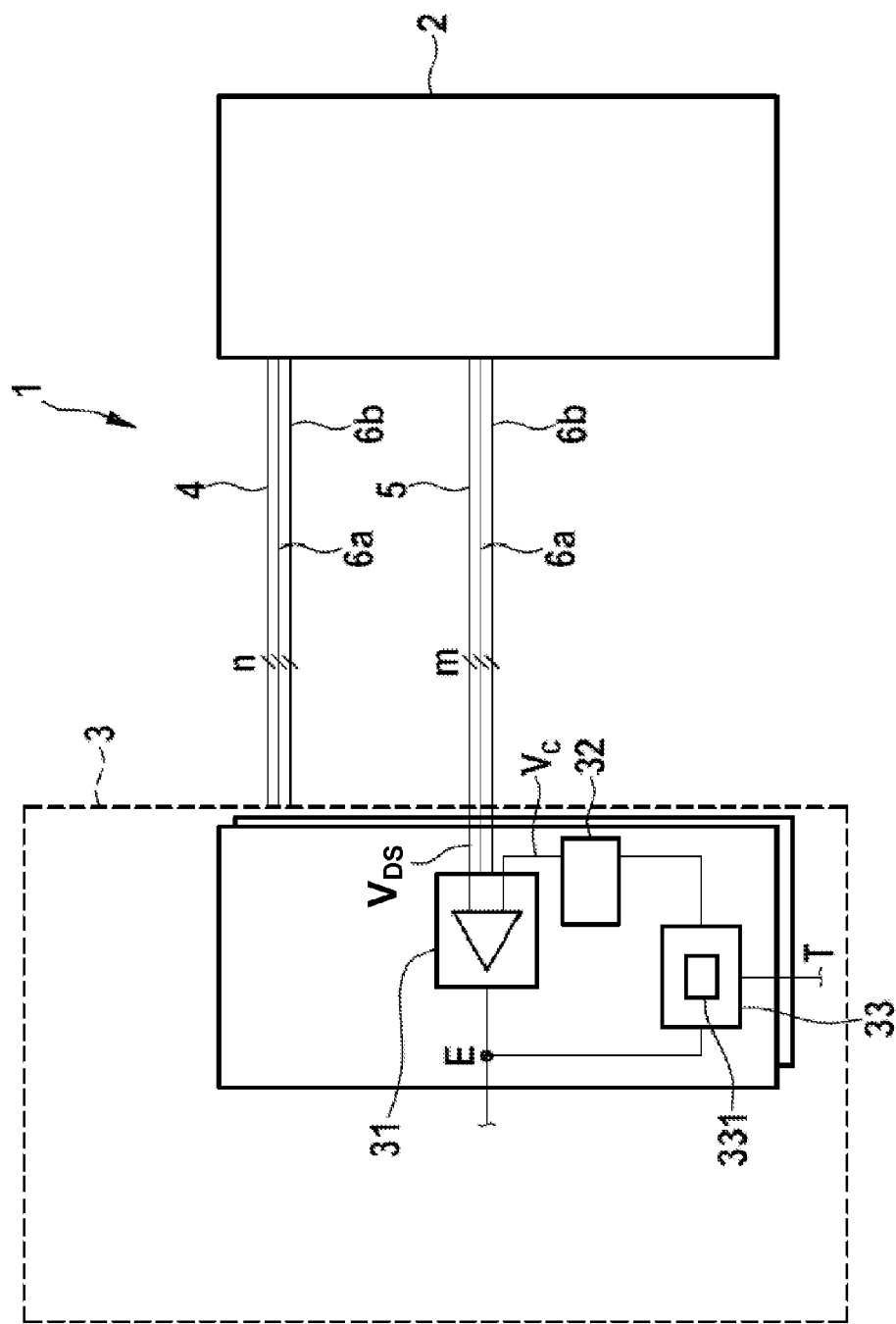
FIG. 1 is a schematic of a memory system including a memory device in the memory controller.

FIG. 1 schematically shows a memory system 1 which may include a memory device 2 and a memory controller 3. The memory device 2 may be configured as a synchronous dynamic random access memory (SDRAM) or any other kinds of memory device types. The memory device 2 communicates with the memory controller 3 via a DDR (double data rate) protocol or the like.

The memory controller 3 may be connected to the memory device 2 by means of a number n of command lines 4 for submitting command signals to the memory device 2. The command lines 4 are meant for transmitting single-ended command signals and configured to provide a unidirectional communication of commands from the memory controller 3 to the memory device 2.

Furthermore, the memory controller 3 may be connected with the memory device 2 by means of a number m of data lines 5. The data lines 5 are meant for transmitting single-ended data signals and configured to provide a bidirectional communication of data to and from the memory device 2.

A pair of differential clock lines 6a, 6b associated to each of the command lines 4 and to each of data lines 5 may provide a differential clock signal to the memory device 2 so that data transferred via the data line 5 can be transmitted in synchronization with a respective associated differential clock signal. The data lines 5 are single-ended so that the respective signal levels of the data signals on the data lines 5 have to be further processed differentially. Therefore, the single-ended data signal on the data lines 5 have to be evaluated with reference to a reference voltage, i.e. the common mode voltage determined by the data signal on the respective data line 5. The evaluation of the data signal is performed by an evaluation unit 31.

The evaluation unit 31 substantially may include a differential continuous time-linear equalizer, a differential limiting amplifier and the like as well-known in the art. Substantially, the evaluation unit 31 evaluates the digital values of an incoming data signal stream by detecting a sign of the difference between the data signal voltage $V_{DS}$ and the reference voltage and to output a digital evaluation signal E depending thereof.

The reference voltage may be supplied by a reference voltage unit 32 which may include a digital-analog converter to provide a preset converter voltage $V_c$ to the evaluation unit 31. The digital-analog converter may be variably set depending on an applied digital analog converter value so that a converter voltage $V_c$ is supplied to the evaluation unit 31. In normal operation the converter voltage $V_c$ may correspond to the reference voltage.

The reference voltage unit 32 may be configured so that for increasing digital analog converter values, the output converter voltage decreases. The converter voltage starts with a high supply potential, such as $V_{DD}$, or close thereto, which corresponds to the digital analog converter value of 0. Increasing the digital analog converter value therefore results in a decreasing output converter voltage $V_c$. Furthermore, the output of the evaluation unit 31 is coupled with the logic unit 33 to determine the coupling of the output evaluation signal E of the evaluation unit 31.

Figure 2:
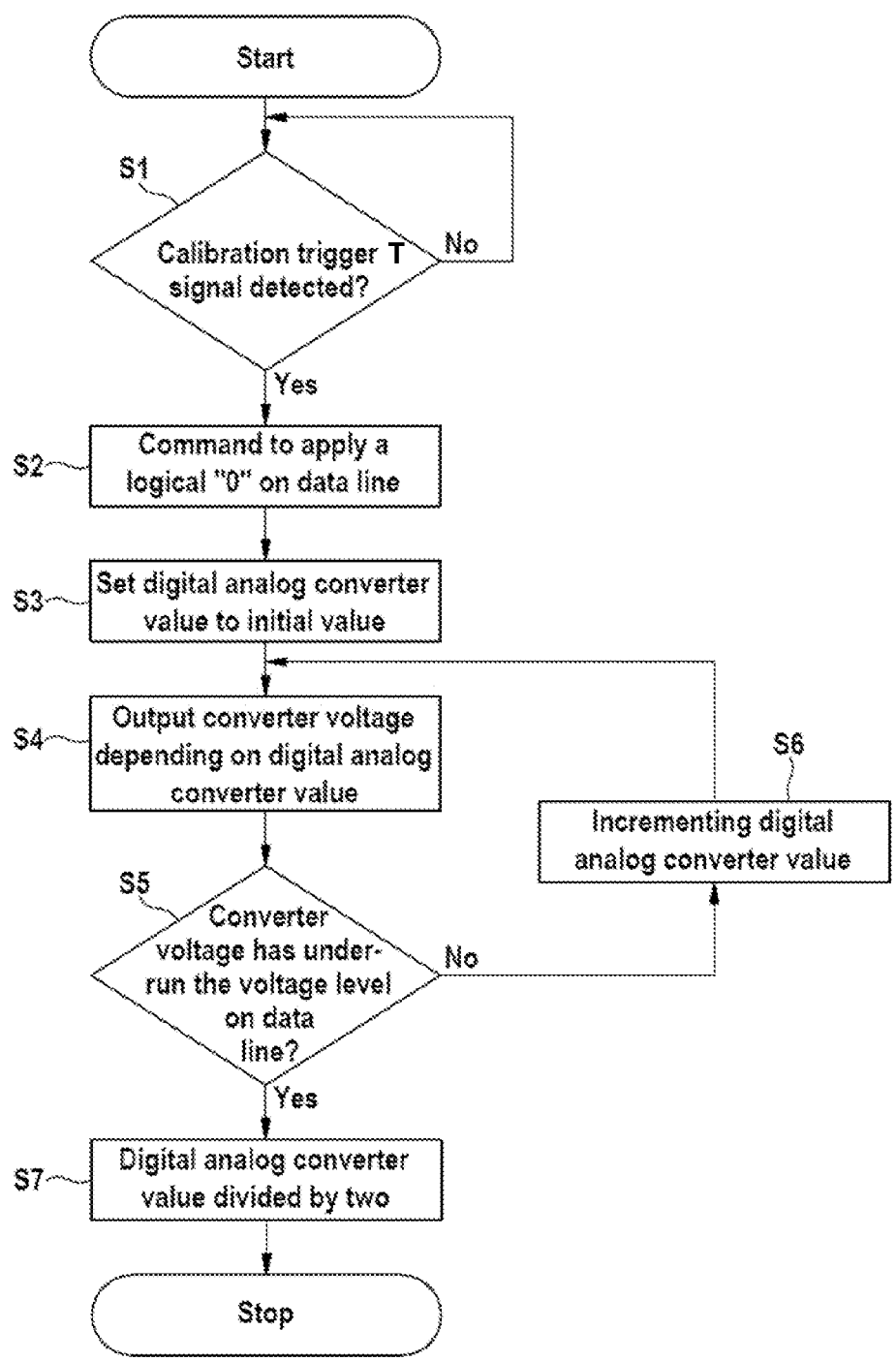
FIG. 2 is a flowchart illustrating a method for calibrating the common mode voltage in the memory controller.

A logic unit 33 is provided which may include a state machine of a kind which is configured to initiate a calibration process for the reference voltage based on a provided calibration trigger signal T, which may indicate that calibration forces for the common mode voltage shall be initiated, as described in FIG. 2. The logic unit 33 may be configured as a simple state machine without any arithmetic processing capability to save area and power of the circuit implementation. The logic unit 33 may include a counter 331.

The evaluation unit 31, the reference voltage unit 32 and the logic unit 33 may form a receiving unit for one of the data lines 5.

The logic unit 33 may initiate a calibration process which is described in conjunction with the flowchart of FIG. 2.

In step S1, it may be checked if a calibration trigger T signal is detected, indicating that calibration forces for the common mode voltage shall be initiated. If this is the case (alternative: yes), the process is continued with step S2, otherwise (alternative: no) it is returned to step S1.

In a step S2, a command is applied onto the command lines 4 to command the memory device 2 that one or more of the data lines 5, a logical "0" shall be applied. The logical "0" corresponds to a low voltage relative to a voltage corresponding to a logical "1" which corresponds to a high voltage, i.e. a voltage higher than the low voltage.

Once the logical "0" is applied at the respective data line 5, a digital analog converter value is set to an initial value in step S3 which may correspond to a minimum value of the digital analog converter value so that a converter voltage corresponding to the digital analog converter value is output to the evaluation unit 31 in step S4. In the present embodiment the digital analog converter value is initially set to a binary "0" so that a maximum converter voltage $V_c$ which corresponds to or is close to the high supply potential $V_{DD}$, is output to the evaluation unit 31.

In step S5, the difference between the output converter voltage $V_c$ and the voltage corresponding to the logical "0" applied on the data line is checked. Substantially it is checked in the logic unit 33 if the evaluation output signal has a change in sign indicating that the converter voltage $V_c$ has underrun the voltage level of the logical "0" applied on the data line 5.

If it is determined that the converter output voltage $V_C$ has underrun the voltage level of the logical "0" (alternative: yes), the process is continued with step S7 otherwise (alternative: no) the process is continued with step S6.

Figure 3:
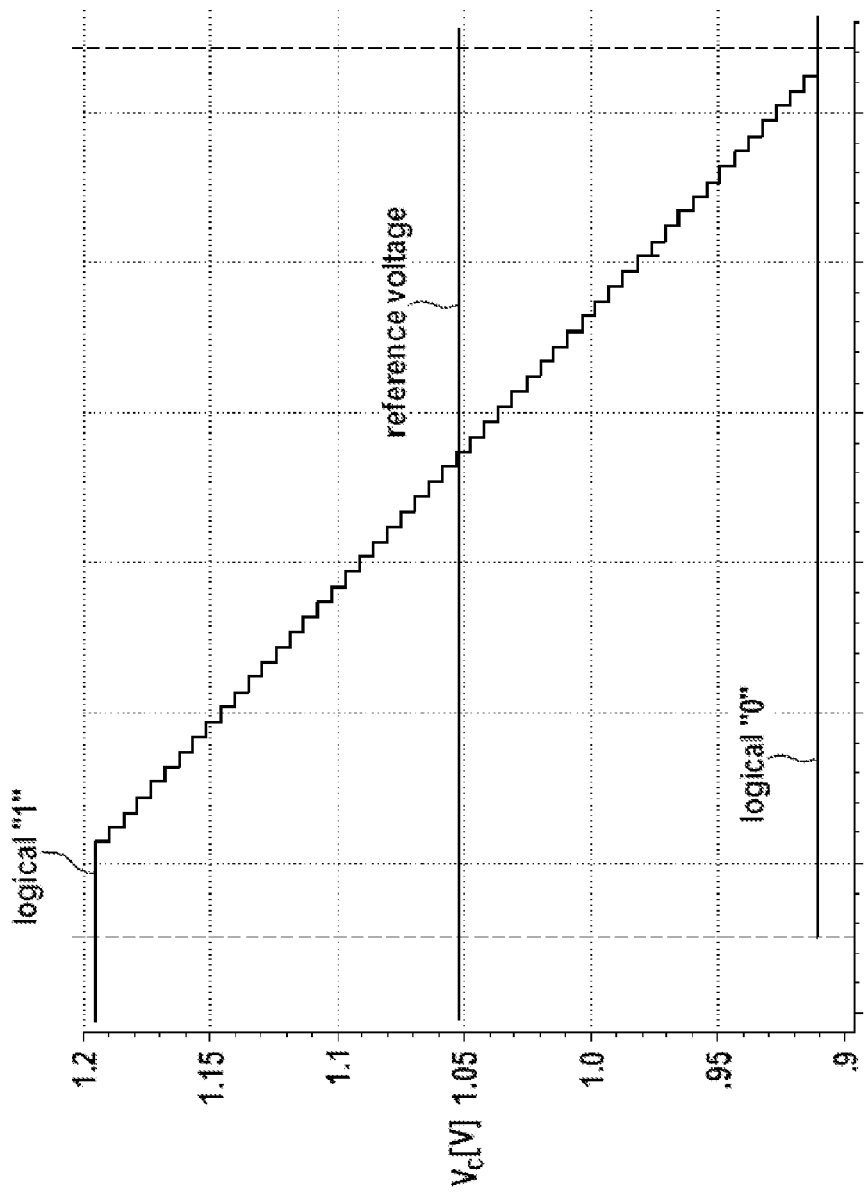
FIG. 3 is a signal diagram showing the ramping down of the digital analog converter output voltage, the voltage level of the logical 0 and the resulting common mode voltage.

In step S6, by means of a counter 331 implemented in the logic unit 33, the digital analog converter value is incremented so that the output converter voltage $V_c$ at the output of the reference voltage unit 32 decreases. This characteristic can be seen in the signal diagram of FIG. 3 where it is shown that the converter output voltage $V_c$ successively decreases.

In step S7 the present digital analog converter value is divided by two in the logic unit 33 to obtain the calibrated reference voltage.

In other words, the reference voltage corresponds to the converter output voltage $V_C$ at the digital analog converter value at which the toggling of the sign of the evaluation output signal occurs, divided by two.

Depending on the type of coding of the digital analog converter value the division by two can be performed in the logic unit 33 by a binary 1-bit shift operation so that the calibrated reference voltage is obtained. For normal operation of the memory controller 3, this calibrated reference voltage is applied to the reference voltage unit 32 to provide a threshold level for the evaluation unit 31.

The division-by-two operation can be performed by a right bit shift or left shift bit shift operation. Depending on the coding scheme, such as a big endian or a little endian the 1-bit-shifting operation might be a left shift or a right shift, respectively.

Instead of a left bit shift operation, in normal mode only the s−1 most right bits of the counter value are used for applying to the reference voltage unit 32, wherein s corresponds to the number of digital digits of the digital analog converter value. Analogously, instead of a right bit shift operation, in normal mode only the s−1 most left bits of the counter value are used for applying to the reference voltage unit 32.

While the embodiments above have been described with respect to a high-terminated signaling scheme such as for instance DDR-4 (multi-drop signaling), it is noted that the same principle of determining the reference voltage can be applied to a ground-referenced signaling scheme such as near-ground signaling (e.g., point-to-point signaling in GDDR). For a ground-referenced signaling the polarities of the evaluation logic and the supply rail can be inverted with respect to the description above but the basic operation principle of ramping up a DAC from binary 0 and dividing the binary code by 2 via a 1-bit shift operation when reaching the logical '1' remains the same.

One of the disadvantages for determining the reference voltage is that in the receiving units of a memory controller 3 usually no extension processing capabilities exist. Therefore, performing even basic numeric operation is only possible if a corresponding arithmetic logical unit (ALU) would be provided. Above method therefore provides a possibility to determine a reference voltage in a calibration routine without providing arithmetic processing capabilities.

What is claimed is:

1. A receiving unit for performing a calibration of a reference voltage to match a common mode voltage, comprising:
    an evaluation unit comprising a differential continuous time-linear equalizer, and a differential limiting amplifier;
    a reference voltage unit comprising a digital-analog converter for digitally generating and applying a digital converter voltage directly to the evaluation unit depending on a converter value, wherein the evaluation unit receives a single-ended data signal from a memory device, and outputs a digital evaluation signal based on the single-ended data signal and the digital converter voltage; and
    a logic unit comprising a counter and configured to perform a calibration process for calibrating the digital converter voltage upon receipt of a calibration trigger signal, wherein the logic unit is configured:

to command the memory device to apply a permanent digital logical state on a data line;
to adapt the digital converter voltage to substantially match the common mode voltage of the permanent digital logical state on the data line; and
wherein the evaluation unit is configured:
to determine the reference voltage depending on the digital converter voltage for which the common mode voltage of the permanent digital logical state on the data line has been substantially matched.

2. The receiving unit according to claim 1, wherein the permanent digital logic state corresponds to a logical state whose voltage level is lower than a voltage level of another digital logical state.

3. The receiving unit according to claim 2, wherein the permanent digital logical state corresponds to a logical "0".

4. The receiving unit according to claim 1, wherein the logic unit is configured to decrement the counter for providing the converter value to successively approach to the common mode voltage level of the logical state from a side of a voltage level of the other permanent digital logical state on the data line.

5. The receiving unit according to claim 4, wherein a voltage level of a logical "1" on the data line corresponds to a high supply voltage.

6. The receiving unit according to claim 1, wherein the logic unit is configured to determine the reference voltage by dividing by 2 the digital converter voltage for which the voltage level of the permanent digital logical state on the data line has been substantially matched.

7. The receiving unit according to claim 6, wherein the logic unit is configured to determine the reference voltage by dividing by 2 the converter value for which the voltage level of the permanent digital logical state on the data line has been substantially matched is divided by two by a bit shift operation defined to obtain a converter value which indicates a voltage between the voltage levels of the logical "0" and the logical "1".

8. The receiving unit according to claim 7, wherein the converter value of the reference voltage unit is big Endian coded, wherein the converter value for which the voltage level of the permanent digital logical state on the data line has been substantially matched is divided by two by a left shift operation.

9. The receiving unit according to claim 7, wherein the converter value of the reference voltage unit is little Endian coded, wherein the converter value for which the voltage level of the permanent digital logical state on the data line has been substantially matched is divided by two by a right shift operation.

10. The receiving unit according to claim 1, wherein the logic unit is implemented by a state machine.

11. A memory controller comprising:
a receiving unit for performing a digital calibration of a reference voltage, comprising:
a converter voltage unit for generating and applying a digitally controlled converter voltage directly on an evaluation unit depending on a converter value, wherein the evaluation unit receives a single-ended data signal and determines an evaluation output signal based on the single-ended data signal and the digitally controlled converter voltage; and
a logic unit configured to perform a calibration process for calibrating a common mode voltage, wherein the logic unit is configured:
to command a memory device to apply a permanent digital logical state on to the single-ended data signal;
to adapt the digitally controlled converter voltage to substantially match the common mode voltage level of the permanent digital logical state on the data line; and
to determine the reference voltage depending on the digitally controlled converter voltage for which the common mode voltage level of the permanent digital logical state on the data line has been substantially matched.

12. A method for performing a calibration of a reference voltage to match a common mode voltage, comprising:
receiving, at an evaluation unit, a single ended data signal from a memory device in response to commanding the memory device to apply a permanent digital logical state on a data line;
receiving, at the evaluation unit, a digitally set converter voltage directly from a digital analog converter in response to a converter value being applied to the digital analog converter, such that the digitally set converter voltage is initially set to a maximum value and an increase in the converter value results in a decrease in the digitally set converter voltage;
incrementing the converter value based on a counter until the evaluation unit output changes from a logical "0" to a logical "1", wherein the evaluation unit outputs a logical "0" in response to the digitally set converter voltage being greater than the single ended data signal and the evaluation unit outputs a logical "1" in response to the digitally set converter voltage being less or equal to than the single ended data signal;
wherein the evaluation unit determines the common mode voltage is equal to a present value of the digitally set converter voltage at a time when the evaluation unit output changes from a logical "0" to a logical "1"; and
setting the reference voltage dependent on the common mode voltage.

13. The method according to claim 12, wherein the permanent digital logic state corresponds to a logical state whose voltage level is lower than a voltage level of another digital logical state.

14. The method according to claim 13, wherein the permanent digital logical state corresponds to a logical "0".

15. The method according to claim 12, wherein a counter is decremented for providing the digitally set converter voltage to successively approach to a voltage level of the logical state from a side of a voltage level of another digital logical state on the data line.

16. The method according to claim 15, wherein the voltage level of a logical "1" on the data line corresponds to a high supply voltage.

17. The method according to claim 12, wherein the reference voltage is determined by dividing by 2 the digitally set converter voltage for which the voltage level of the logical state on the data line has been substantially matched.

18. The method according to claim 17, wherein the digitally set converter voltage for which a voltage level of the logical state on the data line has been substantially matched is divided by two by a bit shift operation defined to obtain the digitally set converter voltage which indicates a voltage between the voltage levels of the logical "0" and the logical "1".

19. The method according to claim 18, wherein the digitally set converter voltage is big Endian coded, wherein the digitally set converter voltage for which the voltage level of the logical state on the data line has been substantially matched is divided by two by a left shift operation.

20. The method according to claim 18, wherein the digitally set converter voltage is little Endian coded, wherein the digitally set converter voltage for which the voltage level of the permanent digital logical state on the data line has been substantially matched is divided by two by a right shift operation.

* * * * *